United States Patent
Ito

(10) Patent No.: US 7,898,351 B2
(45) Date of Patent: Mar. 1, 2011

(54) MODULATION CIRCUIT, MODULATION METHOD, PROGRAM AND COMMUNICATION APPARATUS

(75) Inventor: Koichi Ito, Tokyo (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 12/489,708

(22) Filed: Jun. 23, 2009

(65) Prior Publication Data

US 2009/0315632 A1    Dec. 24, 2009

(30) Foreign Application Priority Data

Jun. 24, 2008    (JP) .......................... P2008-164741

(51) Int. Cl.
- *H03C 1/00* (2006.01)
- *H03C 3/00* (2006.01)
- *H04B 1/04* (2006.01)
- *H04B 1/26* (2006.01)

(52) U.S. Cl. ...................... 332/100; 332/103; 332/117; 332/149; 455/323

(58) Field of Classification Search ......... 332/100–105, 332/117, 145; 327/113; 331/37–43; 455/313, 455/323, 333

See application file for complete search history.

(56) References Cited

U.S. PATENT DOCUMENTS 5,781,076 A * 7/1998 Iwamatsu et al. ........... 332/103

FOREIGN PATENT DOCUMENTS

| JP | 04-207439 | 7/1992 |
| JP | 08-317010 | 11/1996 |
| JP | 10-093448 | 4/1998 |
| JP | 2003-244259 | 8/2003 |

* cited by examiner

*Primary Examiner*—David Mis
(74) *Attorney, Agent, or Firm*—Finnegan, Henderson, Farabow, Garrett & L.L.P.

(57) ABSTRACT

There is provided a modulation circuit including a sampling unit that over-samples an input digital signal based on a multiplying clock signal, and outputs a first over-sampling signal, a first frequency conversion unit that outputs a first high-frequency signal based on the first over-sampling signal and a reference signal, a first filter unit that outputs a second high-frequency signal based on a second over-sampling signal obtained by delaying the first over-sampling signal by one clock and the reference signal, a second filter unit that outputs a third high-frequency signal based on a third over-sampling signal obtained by delaying the second over-sampling signal by one clock and the reference signal, and an adder unit that adds the first high-frequency signal, the second high-frequency signal, and the third high-frequency signal, and outputs an output signal.

9 Claims, 12 Drawing Sheets

MODULATION CIRCUIT, MODULATION METHOD, PROGRAM AND COMMUNICATION APPARATUS

BACKGROUND OF THE INVENTION

1. Field of the Invention

The present invention relates to a modulation circuit, a modulation method, a program, and a communication apparatus.

2. Description of the Related Art

In recent years, various kinds of radio communication apparatus such as a mobile phone, a cordless phone, an apparatus including a WLAN (Wireless Local Area Network) and an apparatus including a WUSB (Wireless Universal Serial Bus) have been widely used. The above radio communication apparatuses have, for example, an orthogonal modulator to allow a digital signal as a transmission signal to be transmitted to external devices after being modulated to a signal of a desired frequency (for example, a RF (Radio Frequency) signal). The orthogonal modulator has, for example, a DAC (Digital to Analog Converter) to modulate a digital signal into an RF signal. Here, a DAC output spectrum may have spectrum folding of the current signal generated by in higher harmonics of sampling frequencies. Thus, the orthogonal modulator has a filter to suppress a folded spectrum. The above filter includes, for example, a reconstruction filter (also referred to as an anti-imaging filter).

Among these, a technologies to implement a filter using a digital circuit are being developed. Non-patent Document 1 is exemplified as technology to implement a reconstruction filter using a digital filter by sampling a digital signal at a frequency twice the sampling frequency or more.

[Non-patent Document 1] Petri Eloranta, Pauli Seppinen, Sami Kallioinen, Tuomas Saarela, Aarno Parssinen, "A Multi mode Transmitter in 0.13 um CMOS Using Direct-Digital RF Modulator", IEEE JOURNAL OF SOLID-STATE CIRCUIT, VOL. 42, NO. 12, DECEMBER 2007.

SUMMARY OF THE INVENTION

In recent years, with a shorter gate length of MOS (Metal Oxide Semiconductor), a higher-speed clock operation of the MOS has become possible. In a related art to implement a filter using a digital circuit, implementation of a reconstruction filter is proposed using a digital filter by making use of the fact that the high-speed clock operation of the MOS has become possible.

Moreover, in recent years, standardization of modulation methods to implement radio communication in still wider bands has been achieved. The above modulation methods include, for example, OFDM (Orthogonal Frequency Division Multiplexing) modulation. In UWB (Ultra Wide Band) and IEEE802.15.3c, which are kinds of standard using OFDM modulation, communication in still wider bands, for example, at several hundred MHz to several GHz is performed than in a modulation method in related art such as FDM (Frequency Division Multiplexing) modulation method. Hereinafter, a band wider than a band used for the modulation method in related art, for example, several hundred MHz to several GHz (the frequency which has several hundred MHz to several GHz or more), will be referred to as an "ultra-wide band".

When communication in the ultra-wide band at several hundred MHz to several GHz described above is performed, an orthogonal converter of a communication apparatus further over-samples high sampling frequencies and signals after being over-sampled are added, multiplied or the like. However, even if the MOS capable of operating high-speed clock is used, it is highly probable that, for example, a delay occurs so that it is very difficult (or unrealistic) to implement a circuit that performs each of the above processing in a digital region. Therefore, even if a related art to implement a filter using a digital circuit is used, implementation of modulation in the ultra-wide band of several hundred MHz to several GHz may not be expected.

When an orthogonal converter of a communication apparatus is constituted by an active analog filter, issues shown below may arise:

If steep frequency characteristics are to be obtained, filter characteristic degradation increases due to temperature or process fluctuations so that it becomes necessary to adjust circuit parameters of the resistance value, capacitor, gm and the like;

When a signal in a wide band is handled, the orthogonal converter becomes more vulnerable to fluctuations and consumed electric current also increases.

Further, when an orthogonal converter of a communication apparatus is constituted by a filter using passive elements, various issues such as a packaging area and increased costs may arise.

Therefore, a modulation circuit to implement modulation in the ultra-wide band like several hundred MHz to several GHz has been desired.

The present invention has been made in view of the above issues, and there is a need for a novel and improved modulation circuit capable of implementing modulation also in the ultra-wide band by dividing processing related to modulation into processing in a digital region and that in a high-frequency region, a modulation method, a program, and a communication apparatus.

According to an embodiment of the present invention, there is provided a modulation circuit, including: a sampling unit that over-samples an input digital signal input on a basis of a multiplying clock signal obtained by multiplying a reference clock, and outputs an over-sampled first over-sampling signal; a first frequency conversion unit that performs frequency conversion of the first over-sampling signal based on the first over-sampling signal and a reference signal having a predetermined phase, and outputs a first high-frequency signal; a first filter unit that delays the first over-sampling signal by one clock, and outputs a second high-frequency signal obtained by performing frequency conversion of a second over-sampling signal based on the second over-sampling signal delayed by one clock and the reference signal; a second filter unit that delays the second over-sampling signal by one clock, and outputs a third high-frequency signal obtained by performing frequency conversion of a third over-sampling signal based on the third over-sampling signal delayed by one clock and the reference signal; and an adder unit that adds the first high-frequency signal, the second high-frequency signal, and the third high-frequency signal, and outputs an output signal.

With the above configuration, processing related to modulation can be divided into processing in a digital region and that in a high-frequency region so that modulation can be implemented also in the ultra-wide band.

Each of the first filter unit and the second filter unit may include: a delay unit that outputs the second over-sampling signal or the third over-sampling signal by delaying the first over-sampling signal or the second over-sampling signal input by one clock respectively; and a second frequency conversion unit that outputs the second high-frequency signal or the third high-frequency signal based on the second over-sampling signal or the third over-sampling signal, and the reference signal respectively.

An input current obtained by multiplying a reference current by a predetermined respective weighting coefficient may be input into each of the first frequency conversion unit and the second frequency conversion unit.

An input current having a same magnitude and obtained by multiplying a reference current by a same weighting coefficient may be input into each of the first frequency conversion unit and the second frequency conversion unit.

The modulation circuit may further include, subsequently to the second filter unit, one or more filter units that delay a signal input by one clock and output a high-frequency signal obtained by performing frequency conversion of the signal delayed by one clock based on the signal delayed by one clock and the reference signal, and the adder unit may output the output signal by adding the first high-frequency signal, the second high-frequency signal, the third high-frequency signal, and one or more high-frequency signals output from the one or more filter units respectively.

The adder unit may include a resonance circuit constituted by an inductor having a predetermined inductance and a capacitor having a predetermined capacitance.

According to the embodiments of the present invention described above, there is provided a modulation method, including the steps of: over-sampling an input digital signal input on a basis of a multiplying clock signal obtained by multiplying a reference clock, and outputting an over-sampled first over-sampling signal; performing frequency conversion of the first over-sampling signal based on the first over-sampling signal and a reference signal having a predetermined phase, and outputting a first high-frequency signal; delaying the first over-sampling signal by one clock, and outputting a second high-frequency signal obtained by performing frequency conversion of a second over-sampling signal based on the second over-sampling signal delayed by one clock and the reference signal; delaying the second over-sampling signal by one clock, and outputting a third high-frequency signal obtained by performing frequency conversion of a third over-sampling signal based on the third over-sampling signal delayed by one clock and the reference signal; and adding the first high-frequency signal, the second high-frequency signal, and the third high-frequency signal, and outputting an output signal.

By using the above method, processing related to modulation can be divided into processing in a digital region and that in a high-frequency region so that modulation can be implemented also in the ultra-wide band.

According to the embodiments of the present invention described above, there is provided a program to cause a computer to execute the steps of: over-sampling an input digital signal input on a basis of a multiplying clock signal obtained by multiplying a reference clock, and outputting an over-sampled first over-sampling signal; performing frequency conversion of the first over-sampling signal based on the first over-sampling signal and a reference signal having a predetermined phase, and outputting a first high-frequency signal; delaying the first over-sampling signal by one clock, and outputting a second high-frequency signal obtained by performing frequency conversion of a second over-sampling signal based on the second over-sampling signal delayed by one clock and the reference signal; delaying the second over-sampling signal by one clock, and outputting a third high-frequency signal obtained by performing frequency conversion of a third over-sampling signal based on the third over-sampling signal delayed by one clock and the reference signal; and adding the first high-frequency signal, the second high-frequency signal, and the third high-frequency signal, and outputting an output signal.

By using the above program, processing related to modulation can be divided into processing in a digital region and that in a high-frequency region so that modulation can be implemented also in the ultra-wide band.

According to the embodiments of the present invention described above, there is provided a communication apparatus including: a phase-shifting unit into which a reference signal having a predetermined phase is input and which outputs the reference signal and an orthogonal reference signal orthogonal to the reference signal; a first modulation unit that outputs a first output signal obtained by performing frequency conversion of a first input digital signal into a high-frequency signal based on the reference signal, a multiplying clock signal obtained by multiplying a reference clock, and the first input digital signal input; a second modulation unit that outputs a second output signal obtained by performing frequency conversion of a second input digital signal into a high-frequency signal based on the orthogonal reference signal, the multiplying clock signal, and the second input digital signal whose phase is orthogonal to that of the first input digital signal; a synthesizing unit that synthesizes the first output signal and the second output signal, and outputs a third output signal; and a communication antenna that transmits a signal in accordance with the third output signal to an external device, wherein each of the first modulation unit and the second modulation unit, including: a sampling unit that over-samples the first input digital signal or the second input digital signal input based on the multiplying clock signal, and outputs an over-sampled first over-sampling signal; a first frequency conversion unit that performs frequency conversion of the first over-sampling signal based on the first over-sampling signal and the reference signal, and outputs a first high-frequency signal; a first filter unit that delays the first over-sampling signal by one clock, and outputs a second high-frequency signal obtained by performing frequency conversion of a second over-sampling signal based on the second over-sampling signal delayed by one clock and the reference signal; a second filter unit that delays the second over-sampling signal by one clock, and outputs a third high-frequency signal obtained by performing frequency conversion of a third over-sampling signal based on the third over-sampling signal delayed by one clock and the reference signal; and an adder unit that adds the first high-frequency signal, the second high-frequency signal, and the third high-frequency signal, and outputs the first output signal or the second output signal.

The above communication apparatus can divide processing related to modulation into processing in a digital region and that in a high-frequency region. With the above configuration, modulation can be performed also in the ultra-wide band so that communication in the ultra-wide band can be implemented.

According to the embodiments of the present invention described above, modulation can be implemented also in the ultra-wide band by dividing processing related to modulation into processing in a digital region and that in a high-frequency region.

DETAILED DESCRIPTION OF THE PREFERRED EMBODIMENTS

Figure 1:
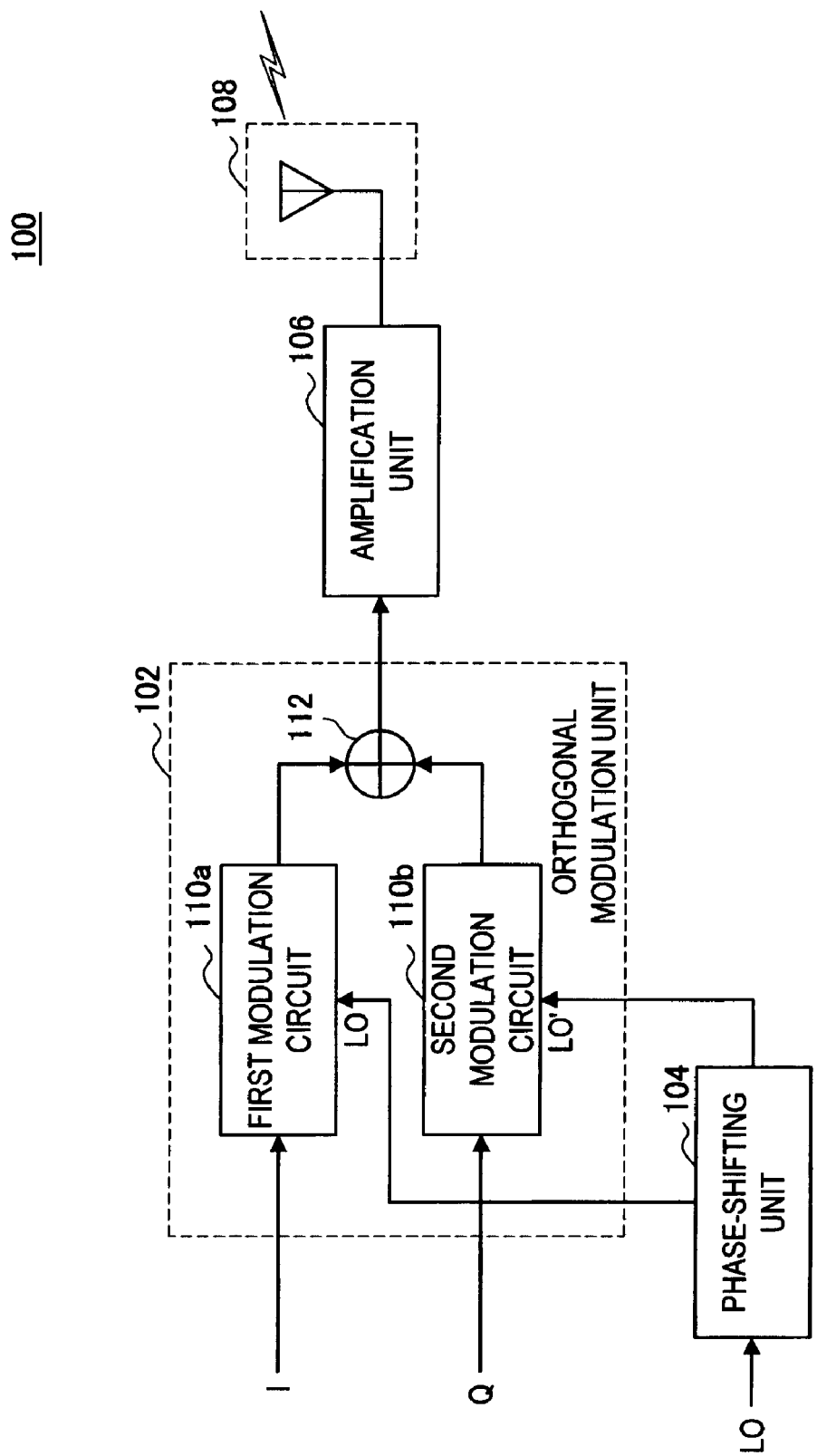
FIG. 1 is an explanatory view showing a communication apparatus according to an embodiment of the present invention.

Hereafter, preferred embodiments of the present invention will be described in detail with reference to the appended drawings. Note that in this specification and the appended drawings, structural elements that have substantially the same functions and structures are denoted with the same reference numerals and a repeated explanation of these structural elements is omitted.

The present invention will be described below in the order shown below:

1. Communication apparatus according to the embodiment of the present invention
2. Modulation circuit according to the embodiment of the present invention
3. Program according to the modulation circuit in the embodiment of the present invention

Communication Apparatus According to the Embodiment of the Present Invention FIG. 1 is an explanatory view showing a communication apparatus 100 according to an embodiment of the present invention. The communication apparatus 100 shown in FIG. 1 is a configuration of communication apparatus according to the embodiment of the present invention and it is needless to say that a communication apparatus according to the embodiment of the present invention is not limited to the configuration of FIG. 1.

Referring to FIG. 1, the communication apparatus 100 includes an orthogonal modulation unit 102, a phase-shifting unit 104, an amplification unit 106, and a communication antenna 108.

The communication apparatus 100 may also include a control unit (not shown), a ROM (read Only Memory; not shown), a RAM (Random Access Memory; not shown), a storage unit (not shown), an operation unit (not shown) that can be operated by a user, and a display unit (not shown). The control unit controls, for example, the whole communication apparatus 100 including, for example, an MPU (Micro Processing Unit). The ROM stores control data such as programs and arithmetic parameters used by the control unit. The RAM primarily stores programs executed by the control unit. The storage unit stores, for example, various kinds of data such as user interface display data and applications. The communication apparatus 100 connects each of the above components by, for example, a bus as a transmission path of data.

Here, the storage unit (not shown) is, for example, a magnetic recording medium such as a hard disk or a nonvolatile memory such as an EEPROM (Electrically Erasable and Programmable Read Only Memory), flash memory, MRAM (Magnetoresistive Random Access Memory), FeRAM (Ferroelectric Random Access Memory), and PRAM (Phase change Random Access Memory), but is not limited to the above examples.

The operation unit (not shown) is, for example, an operation input device such as a keyboard and mouse, a rotary-type selector such as a button, direction key, and jog dial, or a combination of the above units, but is not limited to the above examples. The display unit (not shown) is, for example, an LCD (Liquid Crystal Display), organic EL display (organic ElectroLuminescence display), or OLED display (Organic Light Emitting Diode display), but is not limited to the above examples.

The orthogonal modulation unit 102 has an in-phase signal I (Inphase; hereinafter, referred to as an "I signal") and a quadrature signal Q (Quadrature; hereinafter, referred to as a "Q signal") input thereinto. Then, the orthogonal modulation unit 102 performs frequency conversion of each of the I signal and the Q signal and synthesizes the I signal and the Q signal after the frequency conversion before outputting an RF signal corresponding to a transmission signal (hereinafter, referred to as a "transmission RF signal"). Here, the I signal and the Q signal show transmission signals to be transmitted to an external device. The I signal and the Q signal are generated, for example, by the control unit (not shown), but the generation method thereof is not limited to the above example. Incidentally, the I signal and the Q signal can be regarded as a first input digital signal input into the orthogonal modulation unit 102 and a second input digital signal whose phase is perpendicular to that of the first input digital signal respectively.

Configuration Example of the Orthogonal Modulation Unit 102

The orthogonal modulation unit 102 includes a first modulation circuit 110a, a second modulation circuit 110b, and a synthesizing unit 112.

The first modulation circuit 110a has the I signal, a reference signal LO transmitted from the phase-shifting unit 104 and having a predetermined phase, and a multiplying clock signal obtained by multiplying a reference clock CLK (not shown) input thereinto. Then, the first modulation circuit 110a over-samples the I signal based on the multiplying clock signal and performs frequency conversion of the I signal after being over-sampled into an RF signal (output signal) based on reference signal LO. That is, the first modulation circuit 110a plays the role of a DRFC (Digital RF Converter). Here, the reference clock CLK is generated, for example, by an XO (X'tal Oscillator; crystal oscillator, not shown) provided with the communication apparatus 100. The multiplying clock signal is generated, for example, by a multiplier (not shown) provided with the communication apparatus 100 after the reference clock CLK being input thereinto. It is needless to say that the generation methods of the reference clock CLK and the multiplying clock signal in the communication apparatus 100 are not limited to those described above.

In the first modulation circuit 110a, for example, oversampling is performed in a digital region and frequency conversion processing in an RF region. By dividing processing into processing in the digital region and that in the RF region, the first modulation circuit 110a can perform addition and multiplication processing of signals after being over-sampled in the RF region. That is, the first modulation circuit 110a can prevent an occurrence of unfavorable events such as an occurrence of delay in addition or multiplication of signals after being over-sampled that can arise in an apparatus using the related art in which a filter is implemented using a digital circuit. Therefore, the first modulation circuit 110a can perform modulation also in the ultra-wide band like several hundred MHz to several GHz. A configuration example of the first modulation circuit 110a will be described later.

The second modulation circuit 110b has the Q signal, a reference signal LO' obtained by shifting the phase of the reference signal LO by π/2, and the multiplying clock signal (not shown) input thereinto. Then, the second modulation circuit 110b over-samples the Q signal based on the multiplying clock signal and performs frequency conversion of the Q signal after being over-sampled into an RF signal (output signal) based on reference signal LO'. Here, the second modulation circuit 110b can have a configuration similar to that of the first modulation circuit 110a.

The synthesizing unit 112 synthesizes an RF signal output from the first modulation circuit 110a and that output from the second modulation circuit 110b to output a transmission RF signal (third output signal). Here, the synthesizing unit 112 can be constituted by an adder, but is not limited to the above example.

The orthogonal modulation unit 102 can output, after being constituted as described above, a transmission RF signal by performing frequency conversion of an input digital signal (I signal/Q signal) for orthogonal modulation.

The phase-shifting unit 104 generates a reference signal LO' by shifting the phase of the reference signal LO by π/2 based on the input reference signal LO and outputs the reference signal LO and the reference signal LO'. Here, the phase-shifting unit 104 can be constituted, for example, by a phase shifter. The reference signal LO input into the phase-shifting unit 104 can be generated, for example, by a PLL (Phase-Locked Loop, not shown) provided with the communication apparatus 100, but the generation method thereof is not limited to the above example.

The amplification unit 106 amplifies a transmission RF signal output from the orthogonal modulation unit 102. Here, the amplification unit 106 can be constituted, for example, by an amplifier constituted by a switched capacitor circuit or an operational amplifier, but the constitution method is not limited to the above example. For example, the amplification unit 106 can also be constituted by a discrete time parametric amplifier (MOSFET parametric amplifier) constituted by a MOSFET (Metal Oxide Semiconductor Field effect transistor).

The communication antenna 108 transmits a transmission signal based on a transmission RF signal amplified and output by the amplification unit 106 to an external device.

With the configuration as shown in FIG. 1, the communication apparatus 100 according to the embodiment of the present invention can transmit a transmission signal to an external device by performing orthogonal modulation of a digital signal (I signal/Q signal) as a transmission signal. Though not shown in FIG. 1, the communication antenna 108 can also function as a receiving unit to receive a signal transmitted from an external device, and the communication apparatus 100 can be provided with a demodulation unit (not shown) to demodulate a signal received by the communication antenna 108.

Here, the communication apparatus 100 includes the orthogonal modulation unit 102 having modulation circuits (the first modulation circuit 110a and the second modulation circuit 110b) that perform addition and multiplication processing of signals after being over-sampled in the RF region by dividing processing into processing in the digital region and that in the RF region. With the above configuration, the communication apparatus 100 can prevent an occurrence of unfavorable events such as an occurrence of delay in addition or multiplication of signals after being over-sampled that can arise in an apparatus using the related art in which a filter is implemented using a digital circuit. Therefore, the communication apparatus 100 can perform modulation also in the ultra-wide band like several hundred MHz to several GHz.

In the foregoing, the communication apparatus 100 is taken to describe the embodiment of the present invention, but the embodiment of the present invention is not limited to the above configuration. The embodiment of the present invention can be applied to various kinds of devices, for example, a computer such as a UMPC (Ultra Mobile Personal Computer), a mobile communication device such as a mobile phone, and a mobile game machine such as PlayStation Portable (registered trademark).

Modulation Circuit According to the Embodiment of the Present Invention

Next, a modulation circuit (for example, the first modulation circuit 110a and the second modulation circuit 110b shown in FIG. 1) according to the embodiment of the present invention will be described. The first modulation circuit 110a constituting the orthogonal modulation unit 102 will be taken below as an example to describe a modulation circuit according to the embodiment of the present invention, and a description of the second modulation circuit 110b is omitted because the configuration thereof is similar to that of the first modulation circuit 110a.

An example of a clock signal twice the reference clock CLK being input is taken as a multiplying clock signal being input into a modulation circuit according to the embodiment of the present invention, but the multiplying clock signal according to the embodiment of the present invention is not limited to the above example. For example, various multiplying clock signals such as four times, eight times, and 16 times the reference clock signal may be input into a modulation circuit according to the embodiment of the present invention.

FIRST CONFIGURATION EXAMPLE

Figure 2:
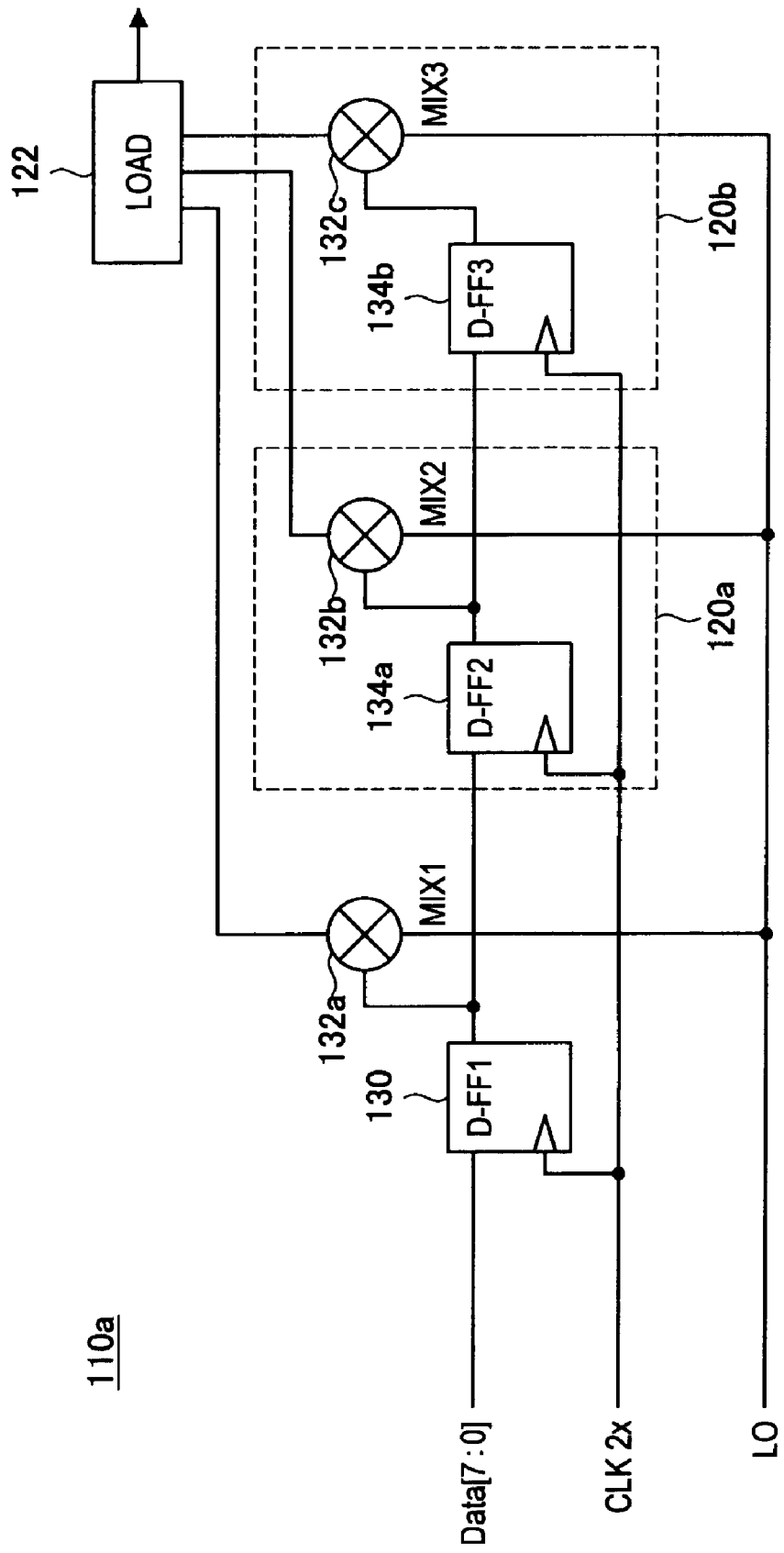
FIG. 2 is an explanatory view showing a first example of a first modulation circuit according to the embodiment of the present invention.

FIG. 2 is an explanatory view showing a first example of a first modulation circuit according to the embodiment of the present invention. Here, FIG. 2 shows an example in which an 8-bit I signal (hereinafter, also referred to as an "input digital signal") is input into the first modulation circuit, but it is needless to say that the I signal is not limited to an 8-bit signal. It is assumed below that the sampling frequency of the input digital signal is fs [Hz]=reference clock CLK.

Referring to FIG. 2, the first example of the first modulation circuit (hereinafter, also referred to as the "first modulation circuit 110a") includes a sampling unit 130, a frequency conversion unit 132a (first frequency conversion unit), a filter unit 120a (first filter unit), a filter unit 120b (second filter unit), and a LOAD 122 (adder unit). Here, the first modulation circuit 110a functions as an FIR (Finite Impulse Response Filter) filter, and the sampling unit 130 and the frequency conversion unit 132a, the filter unit 120a, and the filter unit 120b each correspond to a tap of the FIR filter. That is, FIG. 2 shows an example in which the first modulation circuit 110a is implemented by a FIR filter whose tap number is 3.

The sampling unit 130 over-samples an input digital signal based on the multiplying clock signal (CLK×2) and outputs a first over-sampling signal (digital signal) obtained by the input digital signal being over-sampled. The sampling unit 130 can be constituted, for example, by a D flip-flop circuit (hereinafter, referred to as "D-FF"), but the constitution method is not limited to the above example.

The frequency conversion unit 132a performs frequency conversion of the first over-sampling signal into an RF signal based on the first over-sampling signal and the reference signal LO and outputs a first RF signal (first high-frequency signal).

Configuration Example of the Frequency Conversion Unit 132a

Figure 3:
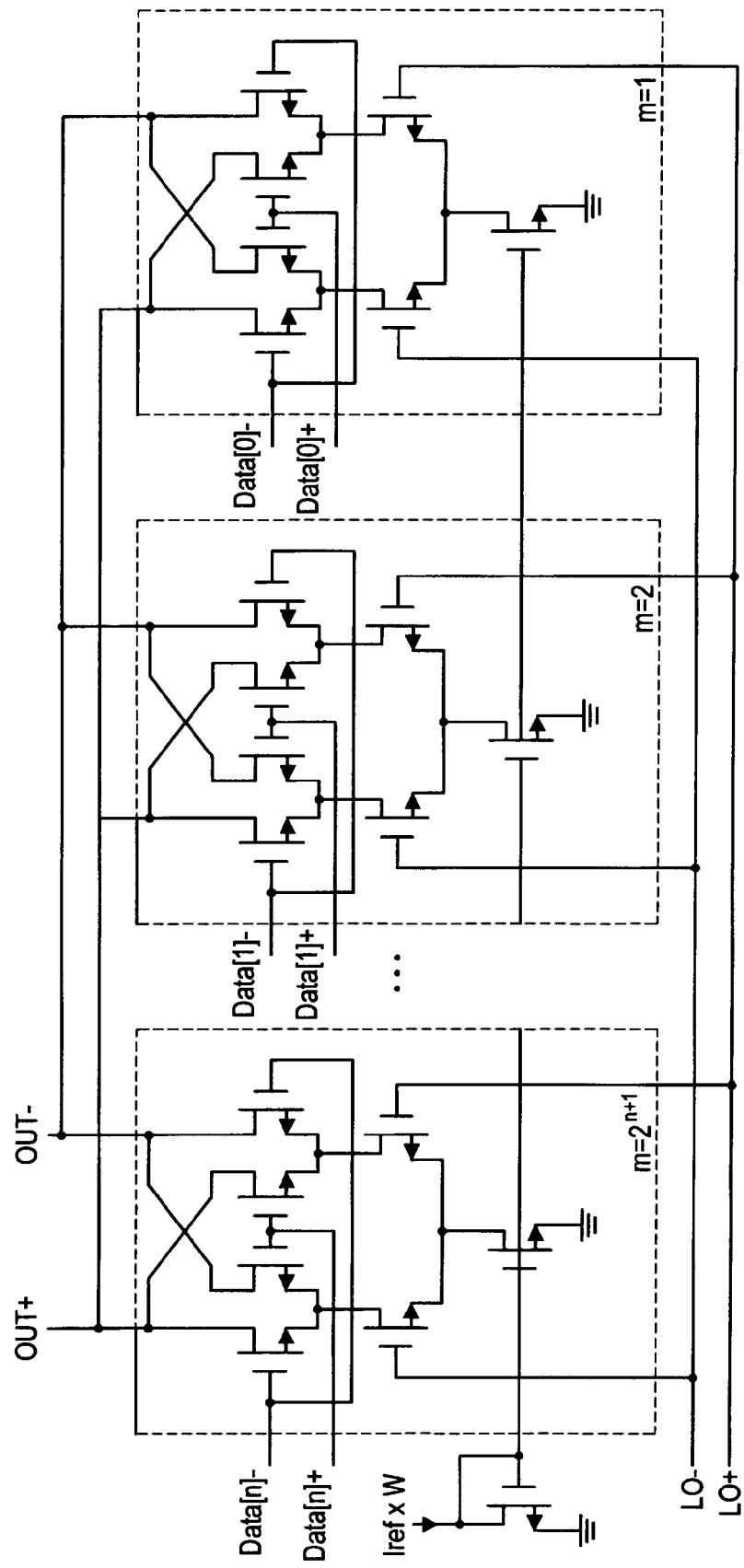
FIG. 3 is an explanatory view exemplifying a configuration of a frequency conversion unit according to the embodiment of the present invention.

FIG. 3 is an explanatory view exemplifying the configuration of the frequency conversion unit 132a according to the embodiment of the present invention. In FIG. 3, the first over-sampling signal and the reference signal LO are each represented as a differential signal.

Referring to FIG. 3, the frequency conversion unit 132a is constituted, for example, by gilbert cell mixers corresponding to each bit of the first over-sampling signal. Here, the gilbert cell mixer is a kind of mixer circuit having low consumed electric current and conversion loss and excellent output waveform characteristics and in which an output current is controlled by an input current being input. FIG. 3 shows an example in which a current Iref×W (Iref is a reference current and W is a weighting factor) is input as the input current. The input current is supplied, for example, from a current source (not shown) provided outside a modulation circuit according to the embodiment of the present invention, but the supply method is not limited to the above example. For example, a modulation circuit according to the embodiment of the present invention may have a current source therein. Moreover, for example, a modulation circuit according to the embodiment of the present invention may further have an amplification circuit to amplify the reference current Iref supplied from the current source to the current Iref×W prior to the frequency conversion unit 132a. With the above configuration, a modulation circuit according to the embodiment of the present invention can adjust tap coefficients (corresponding to the weighting factor W) of an FIR filter.

The frequency conversion unit 132a can weight each bit by being constituted by gilbert cell mixers corresponding to each bit. Here, the weighting method of the frequency conversion unit 132a includes a binary weight (binary weighting), but is not limited to the above method.

Further, the frequency conversion unit 132a can make the tap coefficient of the FIR filter variable, when constituted by gilbert cell mixers, by making the weighting factor W by which the reference current Iref is multiplied variable.

With the frequency conversion unit 132a constituted by gilbert cell mixers as shown in FIG. 3, a modulation circuit according to the embodiment of the present invention can easily change characteristics as a reconstruction filter. It is needless to say that the frequency conversion unit 132a provided with a modulation circuit according to the embodiment of the present invention is not limited to the configuration constituted by gilbert cell mixers. Frequency conversion processing in the frequency conversion unit 132a corresponds to performing multiplication processing of tap coefficients of an FIR filter in the RF region.

The configuration of the first modulation circuit 110a will be described with reference to FIG. 2 again. The filter unit 120a is constituted by a delay unit 134a and a frequency conversion unit 132b.

The delay unit 134a outputs a second over-sampling signal (digital signal) obtained by delaying the first over-sampling signal by one cycle (hereinafter, also referred to as "$\Delta T$", $\Delta T=1/(2\times fs)$) of the multiplying clock signal (CLK×2). Here, the delay unit 134a may be constituted, for example, by D-FF, but the constitution method is not limited to the above example.

The frequency conversion unit 132b performs frequency conversion of the second over-sampling signal into an RF signal based on the second over-sampling signal and the reference signal LO and outputs a second RF signal (second high-frequency signal). Here, the frequency conversion unit 132b may take a configuration similar to that of the frequency conversion unit 132a.

With the above configuration, the filter unit 120a can delay the first over-sampling signal by one clock and output the second RF signal based on the second over-sampling signal delayed by one clock and the reference signal LO.

The filter unit 120b has a configuration similar to that of the filter unit 120a and is constituted by a delay unit 134b and a frequency conversion unit 132c.

The delay unit 134b outputs a third over-sampling signal (digital signal) obtained by delaying the second over-sampling signal by $\Delta T$ of the multiplying clock signal (CLK×2). Here, like the delay unit 134a, the delay unit 134b may be constituted, for example, by D-FF.

The frequency conversion unit 132c performs frequency conversion of the third over-sampling signal into an RF signal based on the third over-sampling signal and the reference signal LO and outputs a third RF signal (third high-frequency signal). Here, the frequency conversion unit 132c may take a configuration similar to that of the frequency conversion unit 132a.

With the above configuration, the filter unit 120b can delay the second over-sampling signal by one clock and output the third RF signal based on the third over-sampling signal delayed by one clock and the reference signal LO.

The LOAD 122 adds an RF signal (output current) output from each of the frequency conversion unit 132a to the frequency conversion unit 132c and outputs an added output RF signal (output signal).

Configuration Example of the LOAD 122 (Adder Unit)

First Example

Figure 4:
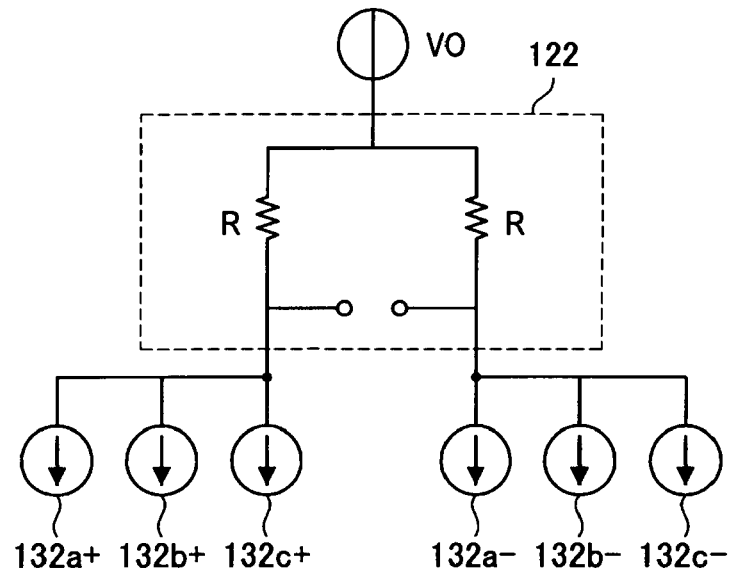
FIG. 4 is an explanatory view showing a first example of a LOAD (adder unit) according to the embodiment of the present invention.

FIG. 4 is an explanatory view showing a first example of the LOAD (adder unit) 122 according to the embodiment of the present invention. Here, FIG. 4 represents each of the frequency conversion unit 132a to the frequency conversion unit 132c as a current source and an RF signal (output current) output from each of the frequency conversion unit 132a to the frequency conversion unit 132c as a differential signal. FIG. 4 also shows a reference supply voltage Vo and the voltage level of the reference supply voltage Vo is appropriately set. FIG. 4 shows a configuration in which the LOAD 122 outputs an output RF signal as a differential signal, but the configuration is not limited to the above example.

As shown in FIG. 4, the LOAD 122 can be constituted by resistors R. However, the LOAD 122 is not limited to a configuration in which the LOAD 122 is constituted by resistors R and may have any configuration that can add and output an RF signal (output current) output from each of the frequency conversion unit 132a to the frequency conversion unit 132c.

Second Example

In the first modulation circuit 110a, an input digital signal is over-sampled by the sampling unit 130 so that it becomes necessary to suppress images generated by the sampling frequency of the multiplying clock signal (CLK×2). Here, FIG. 4 shows an example in which the LOAD 122 is constituted by the resistors R and if the reference clock CLK is sufficiently high, out-of-band images can be suppressed by using frequency characteristics of a device (for example, the amplification unit 106 shown in FIG. 1) subsequent to the first modulation circuit 110a even if the configuration shown in FIG. 4 is used. However, the configuration of the LOAD 122 according to the embodiment of the present invention is not limited to one shown in FIG. 4 and can suppress, for example, images generated by the sampling frequency of the multiplying clock signal (CLK×2).

Figure 5:
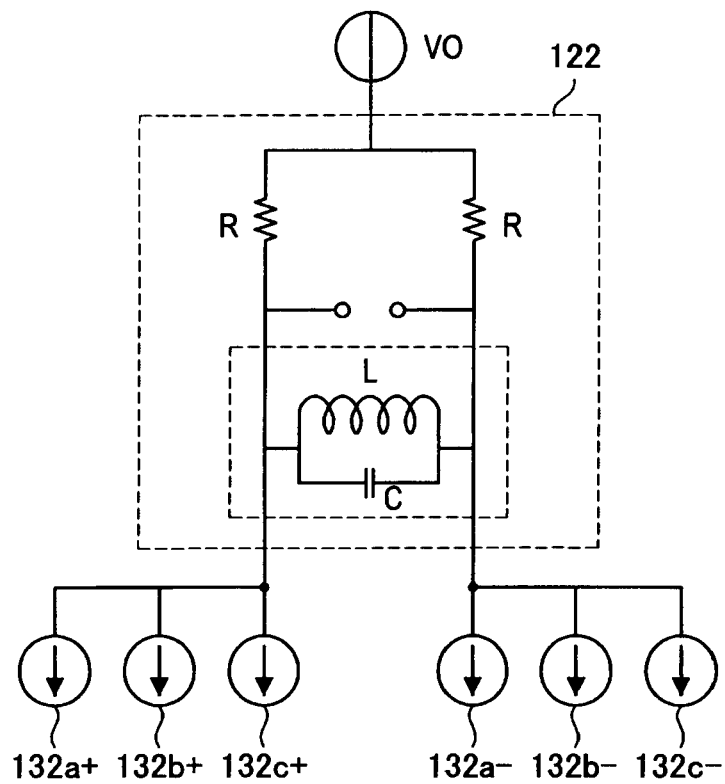
FIG. 5 is an explanatory view showing a second example of the LOAD (adder unit) according to the embodiment of the present invention.

FIG. 5 is an explanatory view showing a second example of the LOAD (adder unit) 122 according to the embodiment of the present invention. Like FIG. 4, FIG. 5 represents each of the frequency conversion unit 132a to the frequency conversion unit 132c as a current source and an RF signal (output current) output from each of the frequency conversion unit 132a to the frequency conversion unit 132c as a differential signal.

Referring to FIG. 5, in addition to the configuration according to the first example shown in FIG. 4, the LOAD 122 according to the second example has an LC tank resonance circuit including an inductor L and a capacitor C between the frequency conversion unit 132a to the frequency conversion unit 132c and output terminals. The LOAD 122 according to the second example can suppress images generated by the sampling frequency of the multiplying clock signal by setting the inductance of the inductor L and the capacitance of the capacitor C to predetermined values (that is, by setting the resonance frequency).

The first modulation circuit 110a can suppress images generated by the sampling frequency of the multiplying clock signal by being provided with the LOAD 122 according to the second example shown in FIG. 5, but the method of suppressing such images is not limited to the above one. For example, the communication apparatus 100 provided with the first modulation circuit 110a may be provided with a resonant element using a dielectric or a ceramic filter subsequent to the orthogonal modulation unit 102 (prior to the amplification unit 106). Even with the above configuration, images generated by the sampling frequency of the multiplying clock signal can be suppressed.

With the configuration shown, for example, in FIG. 4 or FIG. 5, the LOAD 122 can add an RF signal (output current) output from each of the frequency conversion unit 132a to the frequency conversion unit 132c and output an added RF signal (output signal).

With the configuration shown in FIG. 2, the first modulation circuit 110a according to the first example in the embodiment of the present invention can perform multiplication and addition processing of tap coefficients of an FIR filter in the RF region. Therefore, the first modulation circuit 110a can achieve effects, for example, shown in (1) and (2) below:

(1) The first modulation circuit 110a can make tap coefficients of an FIR filter variable in an analog fashion. Thus, the first modulation circuit 110a can make tap coefficients not only integers, but also real numbers.

(2) A delay does not pose any issue in an adding circuit or multiplying circuit like an apparatus using the related art to implement a filter using a digital circuit. Thus, there is no need to consider a delay in an adding circuit or multiplying circuit, which makes the design of a digital filter easier.

Also with the configuration shown in FIG. 2, the first modulation circuit 110a can make over-sampling by the sampling unit 130 and delay processing of a signal by the delay unit 134a and the delay unit 134b a digital operation (processing in the digital region). Therefore, the first modulation circuit 110a can achieve lower power consumption than an apparatus using the related art to implement a filter using a digital circuit.

Further, the first modulation circuit 110a can suppress images resulting from over-sampling by being provided with the LOAD 122 shown in FIG. 5.

The first modulation circuit 110a can perform, as described above, addition and multiplication processing of signals after being over-sampled in the RF region by dividing processing into processing in the digital region and that in the RF region. Therefore, the first modulation circuit 110a can perform modulation also in the ultra-wide band like several hundred MHz to several GHz.

Exemplary Output Spectrum of the First Modulation Circuit 110a

Figure 6:
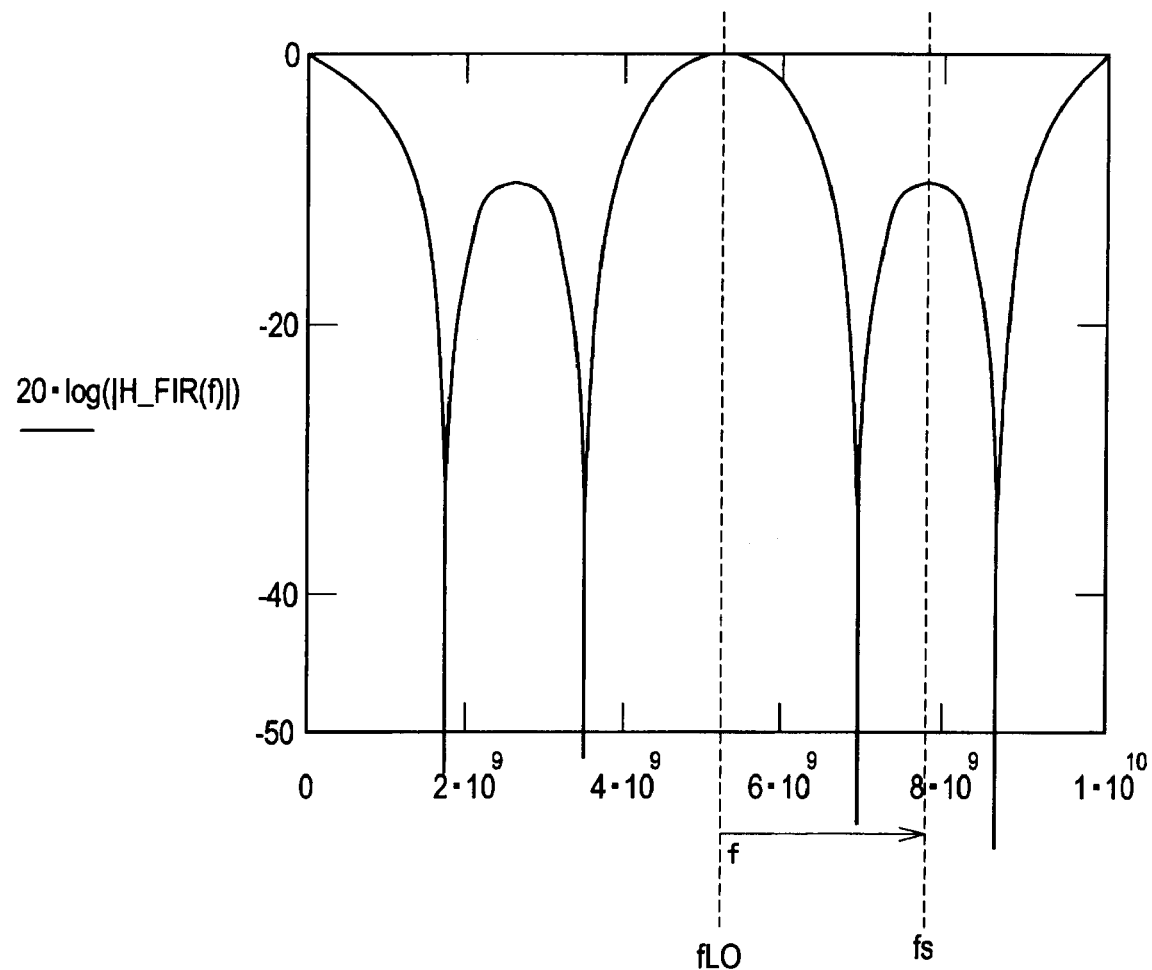
FIG. 6 is an explanatory view showing frequency characteristics of the first modulation circuit according to the first example in the embodiment of the present invention.

Here, an exemplary output spectrum of the first modulation circuit 110a according to the first example in the embodiment of the present invention will be described. FIG. 6 is an explanatory view exemplifying frequency characteristics of the first modulation circuit 110a according to the first example in the embodiment of the present invention.

A transfer function of the FIR filter in the first modulation circuit 110a is represented, for example, by Equation 1 shown below:

$$H(z) = z^{-1} + z^{-2} + z^{-3} \quad \text{(Equation 1)}$$

Frequency conversion is performed in the first modulation circuit 110a shown in FIG. 2 by the frequency conversion unit 132a to the frequency conversion unit 132c (MIX1 to MIX3) and thus, the center frequency (0 [Hz]) of the transfer function shown in Equation 1 becomes the frequency of the reference signal LO (FIG. 6). Here, fLO shown in FIG. 6 is the frequency of the reference signal LO and fs a sampling frequency of a base-band signal (input digital signal). Referring to FIG. 6, the first modulation circuit 110a has NULL points arranged symmetrically with respect to fs and frequency characteristics generating NULL points at 2×fs/3 and 4×fs/3 from fLO.

Figure 7:
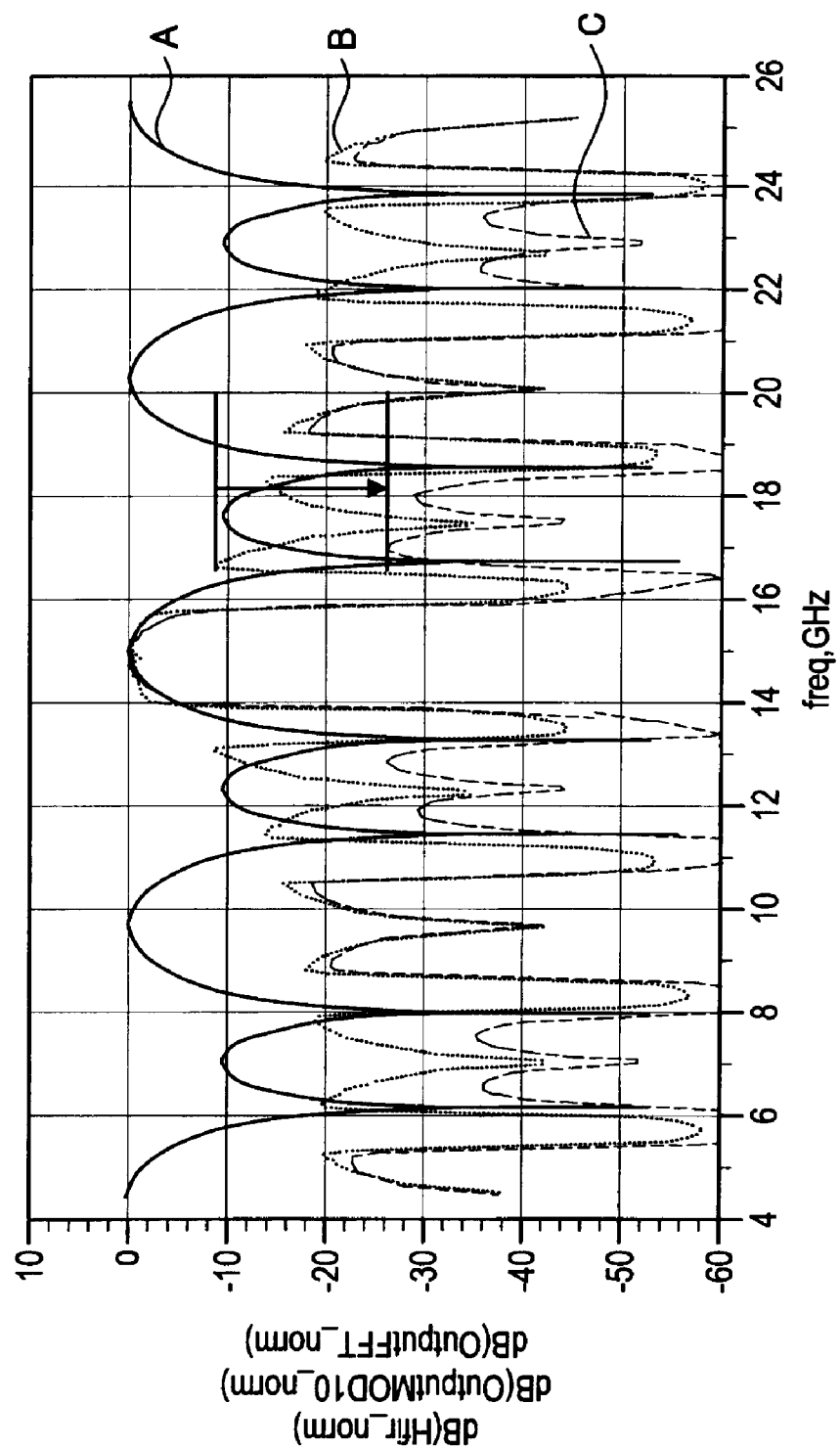
FIG. 7 is an explanatory view exemplifying an output spectrum of the first modulation circuit according to the first example in the embodiment of the present invention.

FIG. 7 is an explanatory view exemplifying an output spectrum of the first modulation circuit 110a according to the first example in the embodiment of the present invention. Here, FIG. 7 shows an example in which the sampling frequency of a digitized base-band signal (input digital signal) is set to 2.6 [GHz], the sampling frequency of a multiplying clock signal to 5.2 [GHz], and the frequency of the reference signal LO to 15 [GHz]. FIG. 7 also shows an example in which the reference current Iref is input into each of the frequency conversion unit 132a to the frequency conversion unit 132c of the first modulation circuit 110a (that is, the weighting factor W=1.0). That is, FIG. 7 shows an example in which an input current of the same magnitude is input into each of the frequency conversion unit 132a to the frequency conversion unit 132c and this corresponds to a setting by which the trap coefficient of each tap in the first modulation circuit 110a is set to be equal.

The waveform indicated by A in FIG. 7 shows frequency characteristics of the first modulation circuit 110a shown in FIG. 6. The waveform indicated by B in FIG. 7 shows an output spectrum when the frequency conversion of a digitized base-band signal (input digital signal) is performed without filtering. The waveform indicated by C in FIG. 7 shows an output spectrum when filtering of a digitized base-band signal (input digital signal) is performed by the first modulation circuit 110a shown in FIG. 2.

As shown by the waveform of B and that of C in FIG. 7, the first modulation circuit 110a can suppress images generated by the sampling frequency of a digitized base-band signal by 17 [dB] or more by performing filtering.

Modulation Method According to the Embodiment of the Present Invention

Figure 8:
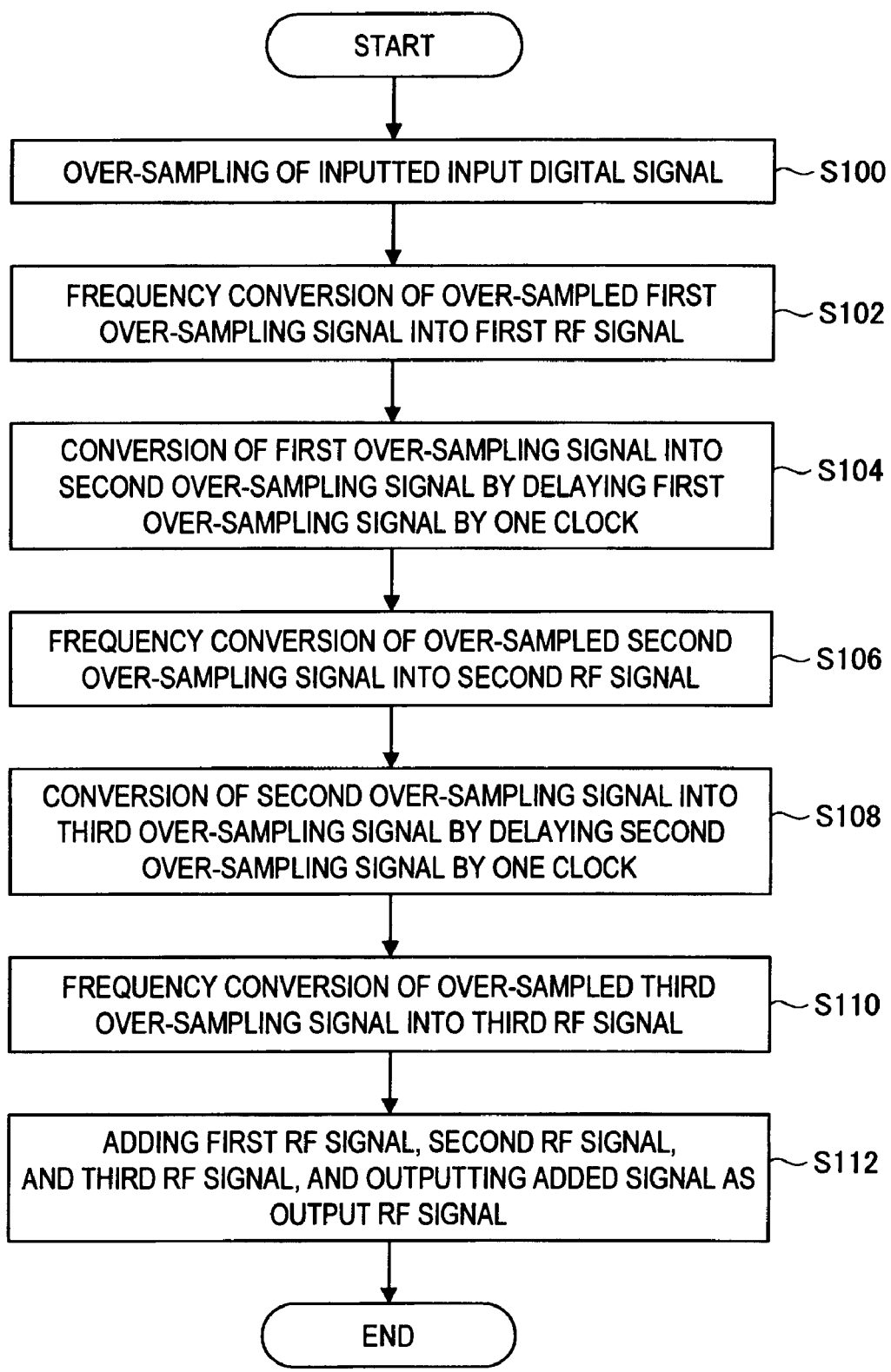
FIG. 8 is a flow chart exemplifying a modulation method according to the embodiment of the present invention.

Next, the modulation method according to the embodiment of the present invention will be described. FIG. 8 is a flow chart exemplifying the modulation method according to the embodiment of the present invention. It is assumed below that the modulation method shown in FIG. 8 is executed by the first modulation circuit 110a.

The first modulation circuit 110a over-samples an input digital signal that has been input and outputs a first over-sampling signal (digital signal) (S100). Here, the first modulation circuit 110a performs over-sampling, for example, by using D-FF, but the method of performing over-sampling is not limited to the above method.

The first modulation circuit 110a performs frequency conversion of the first over-sampling signal output at step S100 into a first RF signal (first harmonic signal) (S102). Here, processing at step S102 corresponds to performing multiplication processing of tap coefficients of an FIR filter in the RF region. The first modulation circuit 110a can convert the first over-sampling signal into the first RF signal, for example, by using gilbert cell mixers, but the conversion method is not limited to the above one. When the first modulation circuit 110a performs processing at step S102 using gilbert cell mixers, the weighting factor W of the input current Iref×W being input into the gilbert cell mixers corresponds to the tap coefficient.

The first modulation circuit 110a converts the first over-sampling signal output at step S100 into a second over-sampling signal (digital signal) by delaying the first over-sampling signal by one clock (S104). Here, the first modulation circuit 110a can delay the first over-sampling signal by one clock, for example, by using D-FF, but the method of delaying is not limited to the above method.

FIG. 8 shows an example in which processing at step S104 is performed after processing at step S102, but the first modulation circuit 110a can perform processing at step S102 and that at step S104 independently. Therefore, the first modulation circuit 110a may perform processing at step S102 after processing at step S104, or processing at step S102 and that at step S104 synchronously.

The first modulation circuit 110a performs frequency conversion of the second over-sampling signal output at step S104 into a second RF signal (second harmonic signal) (S106). Here, like step S102, the first modulation circuit 110a can convert the second over-sampling signal into the second RF signal, for example, by using gilbert cell mixers.

The first modulation circuit 110a converts the second over-sampling signal output at step S104 into a third over-sampling signal (digital signal) by delaying the second over-sampling signal by one clock (S108). Here, like step S104, the first modulation circuit 110a can delay the second over-sampling signal by one clock, for example, by using D-FF.

FIG. 8 shows an example in which processing at step S108 is performed after processing at step S106, but the first modulation circuit 110a can perform processing at step S106 and that at step S108 independently. Therefore, the first modulation circuit 110a may perform processing at step S106 after processing at step S108, or processing at step S106 and that at step S108 synchronously.

The first modulation circuit 110a performs frequency conversion of the third over-sampling signal output at step S108 into a third RF signal (third harmonic signal) (S110). Here, like step S102, the first modulation circuit 110a can convert the third over-sampling signal into the third RF signal, for example, by using gilbert cell mixers.

The first modulation circuit 110a adds the first RF signal converted at step S102, the second RF signal converted at step S106, and the third RF signal converted at step S110 to output an output RF signal (output signal) (S112). Here, processing at step S112 corresponds to performing addition processing of output of each tap of an FIR filter in the RF region. Moreover, the first modulation circuit 110a can add the first RF signal to the third RF signal, for example, by using the LOAD 122 shown in FIG. 4 or FIG. 5, but the addition method is not limited to the above one.

The first modulation circuit 110a can perform up-sampling in the digital region and multiplication and addition processing of tap coefficients of an FIR filter in the RF region by using the method shown in FIG. 8. The first modulation circuit 110a can prevent an occurrence of unfavorable events such as an occurrence of delay in addition or multiplication of signals after being over-sampled by processing being performed by the first modulation circuit 110a after being divided into processing in the digital region and that in the RF region. Therefore, the first modulation circuit 110a can perform modulation also in the ultra-wide band like several hundred MHz to several GHz.

SECOND CONFIGURATION EXAMPLE

In the foregoing, the first modulation circuit 110a constituted by an FIR filter whose tap number is 3, as shown in Equation 1, is described as the first configuration example of a modulation circuit according to the embodiment of the present invention. However, the modulation circuit according to the embodiment of the present invention is not limited to the above one. For example, a modulation circuit according to the embodiment of the present invention may be constituted to function as an FIR filter in which the number of NULL points and frequency arrangement can be appropriately set. Here, the number of NULL points in the FIR filter is determined by the number of taps, and the frequency arrangement in the FIR filter is determined by the tap coefficient. Therefore, the transfer function of the FIR filter in a modulation circuit according to the embodiment of the present invention is represented, for example, by Equation 2 shown below by generalizing the transfer function of Equation 1. Here, αm (m is an integer equal to or greater than 1) shown in Equation 2 denotes the tap coefficient and the number of Z(n) in Equation 2 denotes the number of taps.

$$H(z) = \sum_{m=1}^{n} \alpha_m \cdot Z^{-m}$$ (Equation 2)

Figure 9:
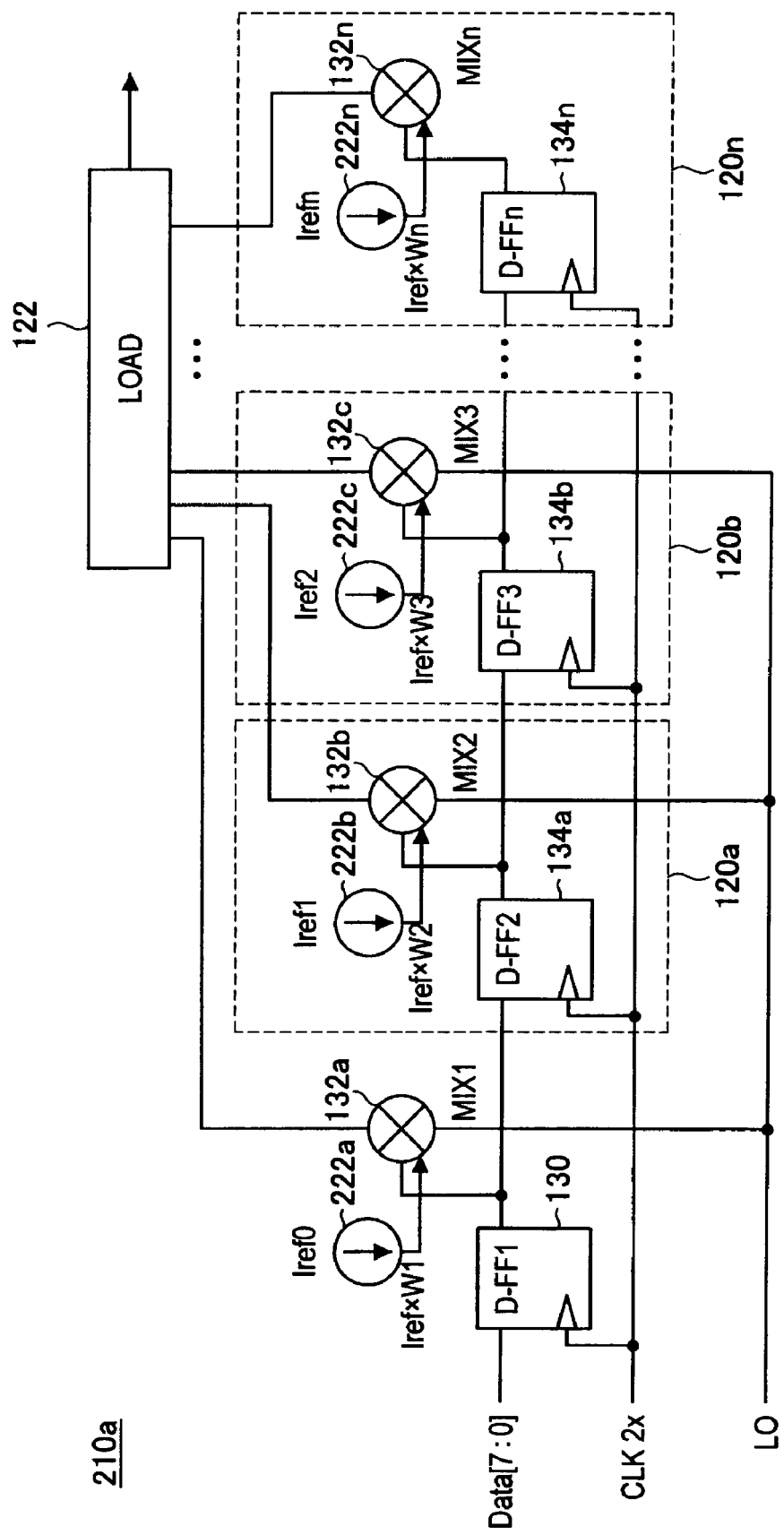
FIG. 9 is an explanatory view showing a second example of the first modulation circuit according to the embodiment of the present invention.

The second configuration example of the first modulation circuit according to the embodiment of the present invention (hereinafter, also referred to as a "first modulation circuit 210a") capable of implementing Equation 2 will be described below. FIG. 9 is an explanatory view showing the second example of the first modulation circuit according to the embodiment of the present invention.

Referring to FIG. 9, the first modulation circuit 210a has basically the same configuration as the first modulation circuit 110a according to the first example shown in FIG. 2, but is different in two points (i) and (ii) shown below.

(i) Number of the Filter Units 120

The filter unit 120 corresponds, as described above, to a tap in an FIR filter. That is, the first modulation circuit 210a shown in FIG. 9 is considered to have a configuration provided with (n+1) taps. Here, when n=2, the number of taps of the FIR filter in the first modulation circuit 210a is the same as that in the first modulation circuit 110a according to the first example shown in FIG. 2. By setting n>2, the first modulation circuit 210a can implement an FIR filter in which more NULL points are provided than in the first modulation circuit 110a according to the first example shown in FIG. 2.

(ii) Magnitude of the Input Current Iref×W Input into Each of the Frequency Conversion Units 132

Frequency conversion processing by the frequency conversion units 132 corresponds, as described above, to performing multiplication processing of tap coefficients of an FIR filter in the RF region. Moreover, as described above, the frequency conversion unit 132 is constituted, for example, by gilbert cell mixers, as shown in FIG. 3, and an output current from the gilbert cell mixers is controlled by the input current Iref×W being input. When the frequency conversion unit 132 is constituted by gilbert cell mixers, the weighting factor W by which the reference current Iref is multiplied corresponds to the tap coefficient.

Therefore, in the first modulation circuit 210a, the tap coefficient αm shown in Equation 2 can be set by changing the magnitude of the input current Iref×W input into each frequency conversion unit 132, that is, the value of the weighting factor W for each frequency conversion unit 132. That is, the weighting factor W can be handled by assuming that the weighting factor is equal to the tap coefficient αm shown in Equation 2.

The first modulation circuit 210a is different from the first modulation circuit 110a according to the first example shown in FIG. 2 in the above points (i) and (ii), but the basic configuration thereof is similar to that of the first modulation circuit 110a. That is, the first modulation circuit 210a according to the second example can perform up-sampling in the digital region and multiplication and addition processing of tap coefficients of an FIR filter in the RF region. Therefore, like the first modulation circuit 110a according to the first example, the first modulation circuit 210a can perform modulation also in the ultra-wide band like several hundred MHz to several GHz.

Exemplary Output Spectrum of the First Modulation Circuit 210a

Figure 10:
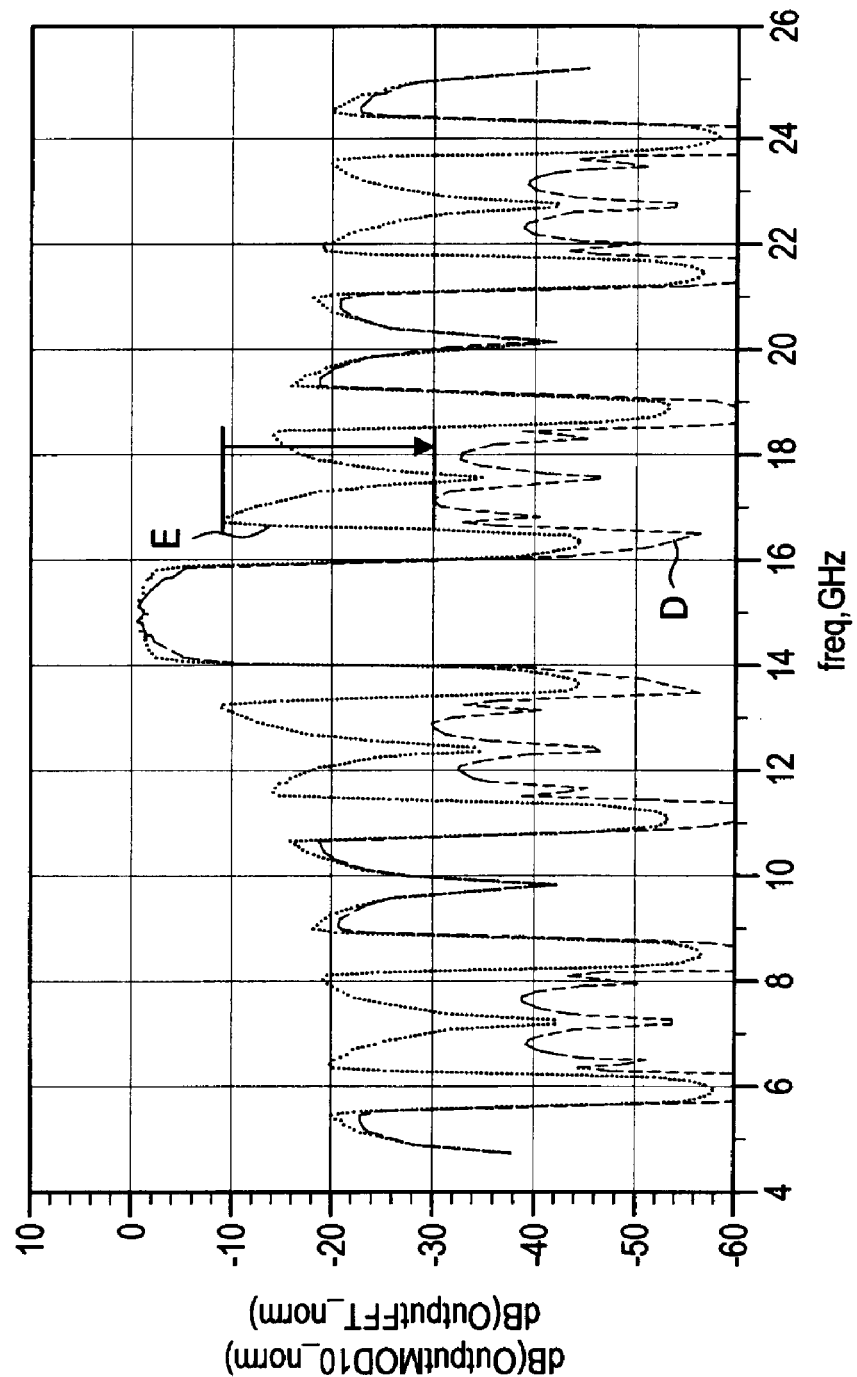
FIG. 10 is an explanatory view exemplifying the output spectrum of the first modulation circuit according to the second example in the embodiment of the present invention.

FIG. 10 is an explanatory view showing another exemplary output spectrum of the first modulation circuit 210a according to the second example in the embodiment of the present invention. Here, FIG. 10 shows, like the first modulation circuit 210a according to the first example, an output spectrum when the number of taps is 3. FIG. 10 also shows, like FIG. 7, an example in which the sampling frequency of a digitized base-band signal (input digital signal) is set to 2.6 [GHz], the sampling frequency of a multiplying clock signal to 5.2 [GHz], and the frequency of the reference signal LO to 15 [GHz].

FIG. 10 also shows an example in which the input current input into the frequency conversion unit 132a and the frequency conversion unit 132c of the first modulation circuit 210a is the reference current Iref (weighting factors W1=W3=1.0) and the current input into the frequency conversion unit 132b is 1.2 Iref (weighting factor W2=1.2). That is, FIG. 10 shows an example in which input currents (Iref0, Iref1, and Iref2) of predetermined magnitudes are input into the frequency conversion unit 132a to the frequency conversion unit 132c respectively and this corresponds to setting the tap coefficient to each tap in the first modulation circuit 210a.

The waveform indicated by D in FIG. 10 shows an output spectrum when frequency conversion of a digitized base-band signal (input digital signal) is performed without filtering. The waveform indicated by E in FIG. 10 shows an output spectrum when filtering of a digitized base-band signal (input digital signal) is performed by the first modulation circuit 210a in which the tap coefficients are set as described above.

Comparison of FIG. 10 and FIG. 7 (an output spectrum according to the first example) shows that NULL points are arranged closer to fs in the first modulation circuit 210a. It is also clear that the first modulation circuit 210a suppresses images generated by the sampling frequency of a digitized base-band signal more than the first modulation circuit 110a according to the first example.

THIRD CONFIGURATION EXAMPLE

In the foregoing, the first configuration example and the second configuration example are shown as a modulation circuit according to the embodiment of the present invention, but the modulation circuit according to the embodiment of the present invention is not limited to the above ones. Thus, next a first modulation circuit 310a according to the third example functioning as a complex FIR filter will be described as a modulation circuit according to the embodiment of the present invention.

Equation 3 shown below is a transfer function of a complex FIR filter obtained by converting the tap coefficient αm represented as a real number of the Equation 2 into a tap coefficient αm_r+αm_i represented as a complex number.

$$H(z) = \sum_{m=1}^{n} (\alpha_{m\_r} + i \cdot \alpha_{m\_i}) \cdot z^{-m}$$ (Equation 3)

If, like Equation 1, the number of taps is 3, the transfer function of the complex FIR filter is represented by Equation 4 shown below. Here, α1, α2, and α3 shown in Equation 4 indicates αm=αm_r+αm_i (m=1, 2, and 3) respectively.

$$H(z)=\alpha_1 \cdot z^{-1}+\alpha_2 \cdot z^{-2}+\alpha_3 \cdot z^{-3} \quad \text{(Equation 4)}$$

As shown in the Equation 3 and Equation 4, a transfer function of a complex FIR filter is represented in the same form as that of a transfer function shown in the Equation 1 and Equation 2.

Figure 11:
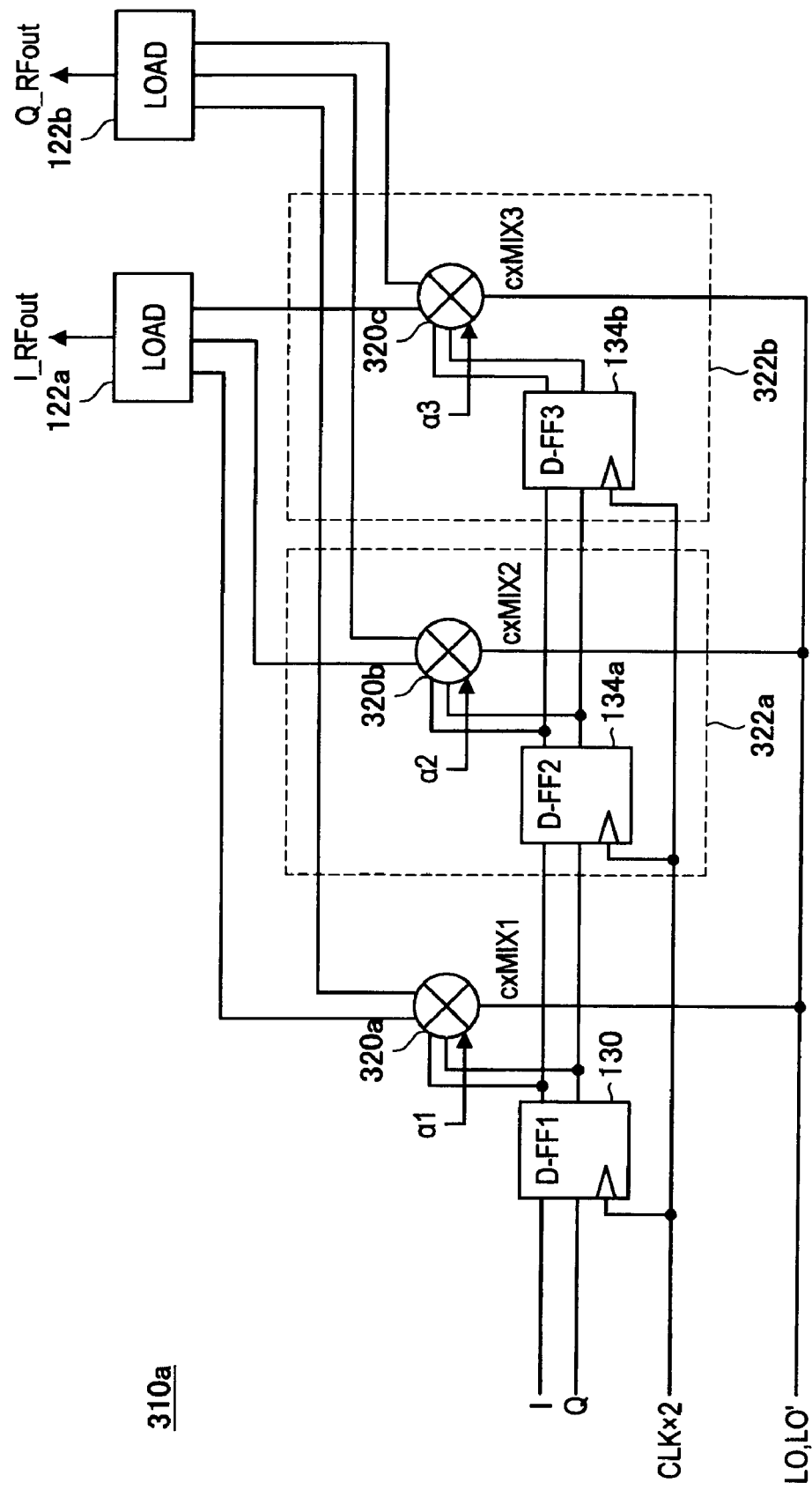
FIG. 11 is an explanatory view showing a third example of the first modulation circuit according to the embodiment of the present invention.

FIG. 11 is an explanatory view showing the third example of the first modulation circuit according to the embodiment of the present invention. Here, the first modulation circuit according to the third example (hereinafter, also referred to as the "first modulation circuit 310a") shown in FIG. 11 shows, like the first modulation circuit 110a according to the first example shown in FIG. 2, a case when the number of taps is 3. It is assumed below that a Q signal and an I signal (orthogonal base-band signals) that are a complex number represented by orthogonal coordinates are input into the first modulation circuit 310a. It is also assumed below that the Q signal and the I signal according to the third example are digital signals, but are not limited to digital signals and may be analog signals. FIG. 11 shows that the reference signal LO and reference signal LO' are supplied by one signal line, but this is shown for convenience's sake and, for example, the reference signal LO and reference signal LO' may be supplied by separate signal lines.

Referring to FIG. 11, the first modulation circuit 310a includes the sampling unit 130, a frequency conversion unit 320a, a filter unit 322a, a filter unit 322b, a LOAD 122a, and a LOAD 122b. FIG. 11 shows an example in which tap coefficients α1, α2, and α3 shown in Equation 4 are input into the first modulation circuit 310a, but what is input into the first modulation circuit 310a is not limited to the above example. For example, like the first modulation circuit 210a according to the second example shown in FIG. 9, an input current may be input into the first modulation circuit 310a.

The sampling unit 130 has the same configuration as that of the sampling unit 130 shown in FIG. 2, and over-samples each of the Q signal and I signal based on the multiplying clock signal (CLK×2) and outputs first over-sampling signals corresponding to each of the Q signal and I signal.

The frequency conversion unit 320a (cxMIX1) multiplies the Q signal and the I signal as the first over-sampling signals each by a complex coefficient α1 to perform frequency conversion based on the frequency of the reference signal LO.

Configuration Example of the Frequency Conversion Unit 320a

Figure 12:
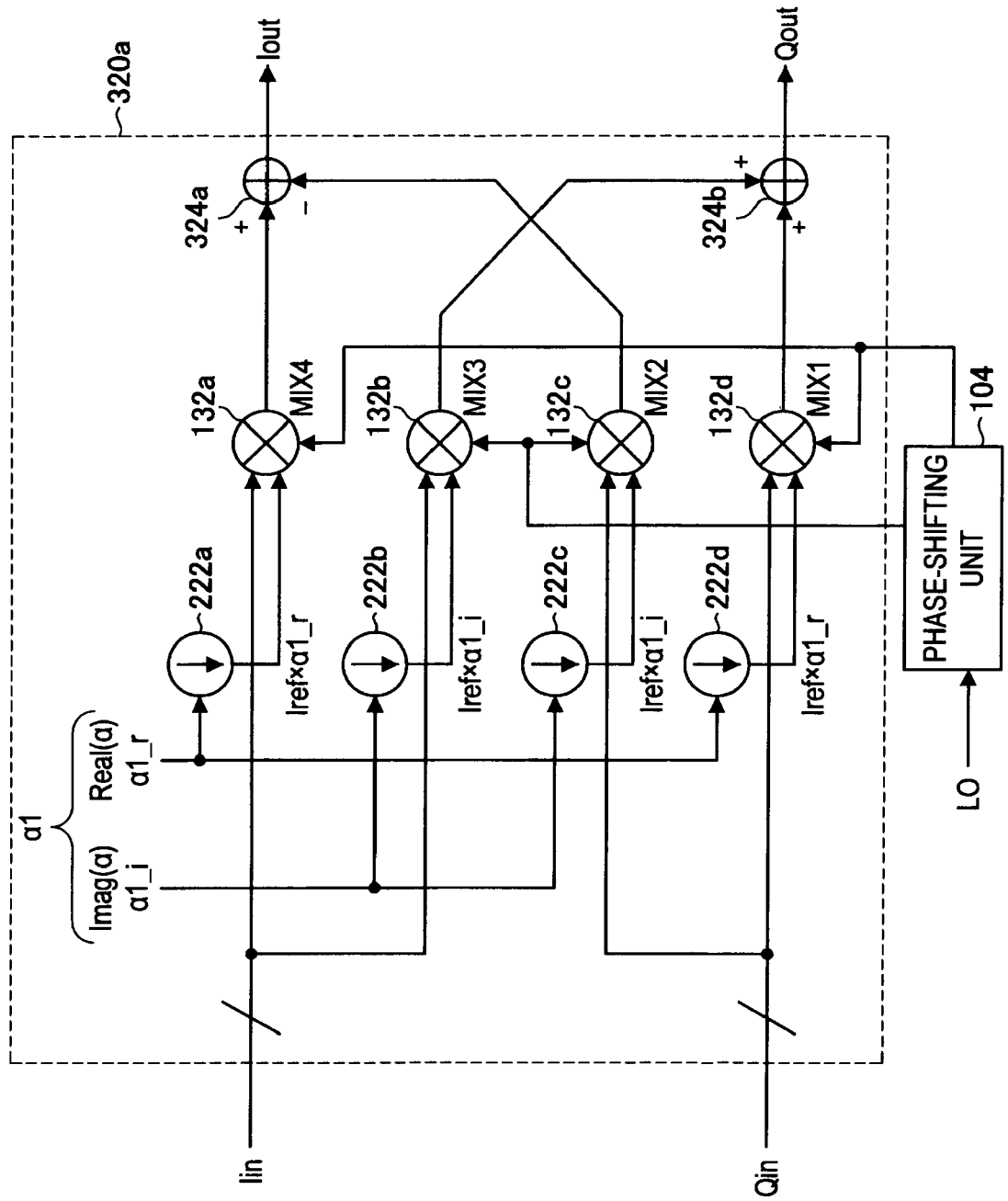
FIG. 12 is an explanatory view exemplifying the configuration of the frequency conversion unit provided in the third example of the first modulation circuit according to the embodiment of the present invention.

FIG. 12 is an explanatory view exemplifying the configuration of the frequency conversion unit 320a provided in the third example of the first modulation circuit according to the embodiment of the present invention. Here, FIG. 12 shows the phase-shifting unit 104 shown in FIG. 1, which is shown for convenience's sake, and shows that the reference signal LO is supplied to the frequency conversion unit 132a and a frequency conversion unit 132d and the reference signal LO' to the frequency conversion unit 132b and a frequency conversion unit 132c. FIG. 12 also shows that α1, which corresponds to the tap coefficient and is denoted as a real part α1_r and an imaginary part α1_i and α1, is input into current sources 222a to 222d supplying input currents to the frequency conversion unit 132a to the frequency conversion unit 132d respectively. It is needless to say that the current sources 222a to 222d shown in FIG. 12 may also be provided, for example, outside the frequency conversion unit 320a or outside the first modulation circuit 310a.

The frequency conversion unit 320a is constituted, for example, by the frequency conversion unit 132a to the frequency conversion unit 132d constituted by gilbert cell mixers and an adder 324a and an adder 324b to synthesize outputs from the frequency conversion unit 132a to the frequency conversion unit 132d. Thus, the frequency conversion unit 320a can output first RF signals corresponding to each of the Q signal and I signal by multiplying the Q signal and I signal as the first over-sampling signals each by a complex coefficient α1 and performing frequency conversion based on the frequency of the reference signal LO. It is needless to say that the configuration of the frequency conversion unit 320a according to the embodiment of the present invention is not limited to that shown in FIG. 12.

The configuration of the first modulation circuit 310a will be described with reference to FIG. 11 again. The filter unit 322a is constituted by the delay unit 134a and a frequency conversion unit 320b.

The delay unit 134a has the same configuration as that of the delay unit 134a shown in FIG. 2 and outputs a Q signal and an I signal as second over-sampling signals obtained by delaying the Q signal and I signal as the first over-sampling signals each by ΔT.

The frequency conversion unit 320b has the same configuration as that of the frequency conversion unit 320a. The frequency conversion unit 320b multiplies the Q signal and I signal as the second over-sampling signals each by a complex coefficient α2 and performing frequency conversion based on the frequency of the reference signal LO. Thus, the frequency conversion unit 320b can output the second RF signals corresponding to each of the Q signal and I signal.

With the above configuration, the filter unit 322a can output the second RF signals corresponding to each of the Q signal and I signal.

The filter unit 322b has the same configuration as that of the filter unit 322a and is constituted by the delay unit 134b and a frequency conversion unit 320c.

The delay unit 134b outputs a Q signal and an I signal as third over-sampling signals obtained by delaying the Q signal and I signal as the second over-sampling signals each by ΔT.

The frequency conversion unit 320c has the same configuration as that of the frequency conversion unit 320a. The frequency conversion unit 320c multiplies the Q signal and I signal as the third over-sampling signals each by a complex coefficient α3 and performs frequency conversion based on the frequency of the reference signal LO. Thus, the frequency conversion unit 320c can output third RF signals corresponding to each of the Q signal and I signal.

The LOAD 122a has the same configuration as that of the LOAD 122 shown in FIG. 2. Thus, the LOAD 122a can add an RF signal (output current) corresponding to the I signal output from each of the frequency conversion unit 320a to the frequency conversion unit 320c to output an output RF signal corresponding to the I signal.

The LOAD 122b has the same configuration as that of the LOAD 122 shown in FIG. 2. Thus, the LOAD 122b can add an RF signal (output current) corresponding to the Q signal output from each of the frequency conversion unit 320a to the frequency conversion unit 320c to output an output RF signal corresponding to the Q signal.

Frequency Characteristics of the First Modulation Circuit 310a

Figure 13:
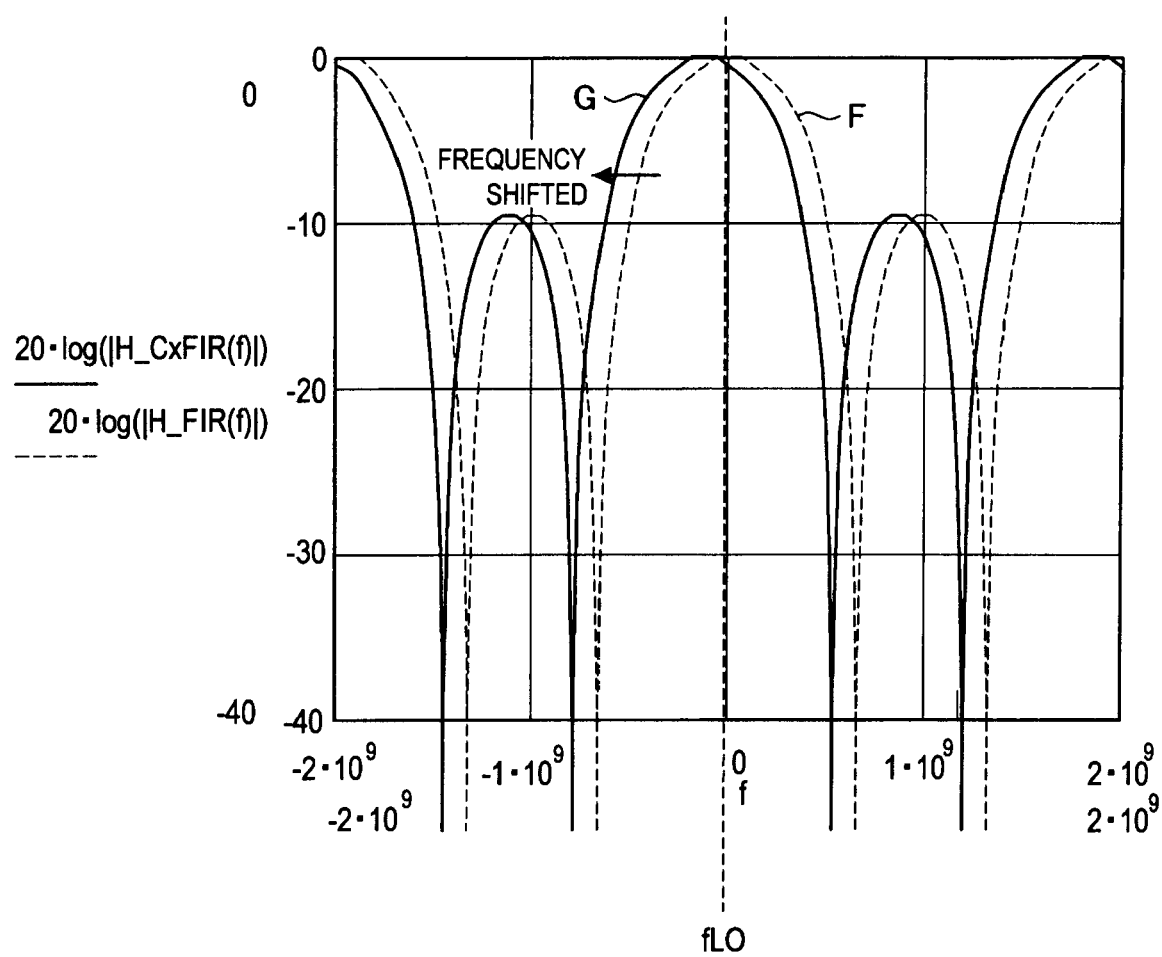
FIG. 13 is an explanatory view showing frequency characteristics of the first modulation circuit according to the third example in the embodiment of the present invention.

FIG. 13 is an explanatory view showing frequency characteristics of the first modulation circuit 310a according to the third example in the embodiment of the present invention.

Here, F shown in FIG. 13 is a waveform corresponding to frequency characteristics shown in FIG. 6. G shown in FIG. 13 is a waveform corresponding to frequency characteristics of the first modulation circuit 310a shown in FIG. 11, that is, frequency characteristics of a complex FIR filter.

It is clear, as shown in FIG. 13, that the first modulation circuit 310a has frequency characteristics similar to those of the first modulation circuit 110a according to the first example shown in FIG. 6, though frequencies thereof are shifted. Theoretically, tap coefficients in Equation 1 can be converted into complex numbers by converting z shown in Equation 1 like Equation 5 shown below. Here, fshift in Equation 5 is a shift amount of frequency and $\Delta T$ is the time of one cycle of a multiplied clock signal.

$$z = z \cdot e^{i \cdot 2\pi f_{shift} \cdot \Delta T} \quad \text{(Equation 5)}$$

The first modulation circuit 310a according to the third example has, as show above, basically the same frequency characteristics as those of the first modulation circuit 110a according to the first example. Moreover, as shown in FIG. 11, the first modulation circuit 310a performs up-sampling in the digital region and multiplication and addition processing of tap coefficients of a complex FIR filter in the RF region. Therefore, like the first modulation circuit 110a according to the first example, the first modulation circuit 310a can perform modulation also in the ultra-wide band like several hundred MHz to several GHz.

As described above, a modulation circuit according to the embodiment of the present invention has, for example, a configuration according to the first example to the third example. Therefore, a modulation circuit according to the embodiment of the present invention can implement modulation also in the ultra-wide band by dividing processing related to modulation into processing in the digital region and that in the RF region.

Program According to a Modulation Circuit in the Embodiment of the Present Invention Modulation also in the ultra-wide band can be implemented by dividing processing related to modulation into processing in the digital region and that in the RF region using a program that causes a computer to function as a modulation unit (corresponding to the first modulation circuit 110a according to the first example/the first modulation circuit 210a according to the second example/the first modulation circuit 310a according to the third example) according to the embodiment of the present invention.

The present application contains subject matter related to that disclosed in Japanese Priority Patent Application JP 2008-164741 filed in the Japan Patent Office on Jun. 24, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

In the foregoing, for example, that a program (computer program) to cause a computer to function as a modulation unit (corresponding to a modulation circuit) according to the embodiment of the present invention is provided is shown, but the embodiment of the present invention can further be provided together with a storage medium in which the program is stored.

The above configuration shows only an example of the embodiment of the present invention and belongs naturally to the technical scope of the present invention.

What is claimed is:

1. A modulation circuit comprising:
   a sampling unit that over-samples an input digital signal input on a basis of a multiplying clock signal obtained by multiplying a reference clock, and outputs an over-sampled first over-sampling signal;
   a first frequency conversion unit that performs frequency conversion of the first over-sampling signal based on the first over-sampling signal and a reference signal having a predetermined phase, and outputs a first high-frequency signal;
   a first filter unit that delays the first over-sampling signal by one clock, and outputs a second high-frequency signal obtained by performing frequency conversion of a second over-sampling signal based on the second over-sampling signal delayed by one clock and the reference signal;
   a second filter unit that delays the second over-sampling signal by one clock, and outputs a third high-frequency signal obtained by performing frequency conversion of a third over-sampling signal based on the third over-sampling signal delayed by one clock and the reference signal; and
   an adder unit that adds the first high-frequency signal, the second high-frequency signal, and the third high-frequency signal, and outputs an output signal.

2. The modulation circuit according to claim 1, wherein each of the first filter unit and the second filter unit includes
   a delay unit that outputs the second over-sampling signal or the third over-sampling signal by delaying the first over-sampling signal or the second over-sampling signal input by one clock respectively, and
   a second frequency conversion unit that outputs the second high-frequency signal or the third high-frequency signal based on the second over-sampling signal or the third over-sampling signal, and the reference signal respectively.

3. The modulation circuit according to claim 2, wherein an input current obtained by multiplying a reference current by a predetermined respective weighting coefficient is input into each of the first frequency conversion unit and the second frequency conversion unit.

4. The modulation circuit according to claim 2, wherein an input current having a same magnitude and obtained by multiplying a reference current by a same weighting coefficient is input into each of the first frequency conversion unit and the second frequency conversion unit.

5. The modulation circuit according to claim 1, further comprising, subsequently to the second filter unit, one or more filter units that delay a signal input by one clock and output a high-frequency signal obtained by performing frequency conversion of the signal delayed by one clock based on the signal delayed by one clock and the reference signal subsequent to the second filter unit, wherein
   the adder unit outputs the output signal by adding the first high-frequency signal, the second high-frequency signal, the third high-frequency signal, and one or more high-frequency signals output from the one or more filter units respectively.

6. The modulation circuit according to claim 1, wherein the adder unit includes a resonance circuit constituted by an inductor having a predetermined inductance and a capacitor having a predetermined capacitance.

7. A modulation method comprising the steps of:
over-sampling an input digital signal input on a basis of a multiplying clock signal obtained by multiplying a reference clock, and outputting an over-sampled first over-sampling signal;
performing frequency conversion of the first over-sampling signal based on the first over-sampling signal and a reference signal having a predetermined phase, and outputting a first high-frequency signal;
delaying the first over-sampling signal by one clock, and outputting a second high-frequency signal obtained by performing frequency conversion of a second over-sampling signal based on the second over-sampling signal delayed by one clock and the reference signal;
delaying the second over-sampling signal by one clock, and outputting a third high-frequency signal obtained by performing frequency conversion of a third over-sampling signal based on the third over-sampling signal delayed by one clock and the reference signal; and
adding the first high-frequency signal, the second high-frequency signal, and the third high-frequency signal, and outputting an output signal.

8. A program to cause a computer to execute the steps of:
over-sampling an input digital signal input on a basis of a multiplying clock signal obtained by multiplying a reference clock, and outputting an over-sampled first over-sampling signal;
performing frequency conversion of the first over-sampling signal based on the first over-sampling signal and a reference signal having a predetermined phase, and outputting a first high-frequency signal;
delaying the first over-sampling signal by one clock, and outputting a second high-frequency signal obtained by performing frequency conversion of a second over-sampling signal based on the second over-sampling signal delayed by one clock and the reference signal;
delaying the second over-sampling signal by one clock, and outputting a third high-frequency signal obtained by performing frequency conversion of a third over-sampling signal based on the third over-sampling signal delayed by one clock and the reference signal; and
adding the first high-frequency signal, the second high-frequency signal, and the third high-frequency signal, and outputting an output signal.

9. A communication apparatus comprising:
a phase-shifting unit into which a reference signal having a predetermined phase is input and which outputs the reference signal and an orthogonal reference signal orthogonal to the reference signal;
a first modulation unit that outputs a first output signal obtained by performing frequency conversion of a first input digital signal into a high-frequency signal based on the reference signal, a multiplying clock signal obtained by multiplying a reference clock, and the first input digital signal input;
a second modulation unit that outputs a second output signal obtained by performing frequency conversion of a second input digital signal into a high-frequency signal based on the orthogonal reference signal, the multiplying clock signal, and the second input digital signal whose phase is orthogonal to that of the first input digital signal;
a synthesizing unit that synthesizes the first output signal and the second output signal, and outputs a third output signal; and
a communication antenna that transmits a signal in accordance with the third output signal to an external device, wherein
each of the first modulation unit and the second modulation unit includes
a sampling unit that over-samples the first input digital signal or the second input digital signal input based on the multiplying clock signal, and outputs an over-sampled first over-sampling signal,
a first frequency conversion unit that performs frequency conversion of the first over-sampling signal based on the first over-sampling signal and the reference signal, and outputs a first high-frequency signal,
a first filter unit that delays the first over-sampling signal by one clock, and outputs a second high-frequency signal obtained by performing frequency conversion of a second over-sampling signal based on the second over-sampling signal delayed by one clock and the reference signal,
a second filter unit that delays the second over-sampling signal by one clock, and outputs a third high-frequency signal obtained by performing frequency conversion of a third over-sampling signal based on the third over-sampling signal delayed by one clock and the reference signal, and
an adder unit that adds the first high-frequency signal, the second high-frequency signal, and the third high-frequency signal, and outputs the first output signal or the second output signal.

* * * * *